(12) United States Patent
Miyasaka

(10) Patent No.: US 6,974,754 B2
(45) Date of Patent: Dec. 13, 2005

(54) SEMICONDUCTOR DEVICE INCLUDING FERROELECTRIC CAPACITORS AND FABRICATING METHOD THEREOF

(75) Inventor: Yoichi Miyasaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 67 days.

(21) Appl. No.: 10/446,829

(22) Filed: May 29, 2003

(65) Prior Publication Data

US 2003/0224538 A1    Dec. 4, 2003

(30) Foreign Application Priority Data

May 29, 2002   (JP) .................................. 155505

(51) Int. Cl.$^7$ ............................................. H01L 21/20
(52) U.S. Cl. ......................... 438/396; 438/3; 438/240
(58) Field of Search ........................... 438/396, 3, 240, 438/253

(56) References Cited

U.S. PATENT DOCUMENTS

| | | | |
|---|---|---|---|
| 6,548,343 B1 | 4/2003 | Summerfelt et al. | |
| 6,600,183 B1 * | 7/2003 | Visokay et al. | ............. 257/295 |
| 6,727,156 B2 * | 4/2004 | Jung et al. | ................. 438/396 |
| 2001/0010377 A1 | 8/2001 | Cuchiaro et al. | |
| 2001/0038115 A1 | 11/2001 | Amanuma | |

FOREIGN PATENT DOCUMENTS

JP        11-317500 A    11/1999

\* cited by examiner

*Primary Examiner*—David Nelms
*Assistant Examiner*—Quoc Hoang
(74) *Attorney, Agent, or Firm*—Sughrue Mion, PLLC

(57) ABSTRACT

An embodiment of the present invention is a method of fabricating a semiconductor device. The method comprises forming a film of bottom electrode material entirely over the dielectric film; etching the bottom electrode film to partially define a sidewall of each of bottom electrodes; forming a film of ferroelectric material on the remainder of the bottom electrode film and the exposed surface of the dielectric film; forming a film of top electrode material on the ferroelectric film; and etching the top electrode film, the ferroelectric film and the remainder of the bottom electrode film until the surface of the dielectric film is exposed to completely define the sidewall of each of the bottom electrodes.

19 Claims, 6 Drawing Sheets

SEMICONDUCTOR DEVICE INCLUDING FERROELECTRIC CAPACITORS AND FABRICATING METHOD THEREOF

BACKGROUND OF THE INVENTION

1. Field of the Invention

The present invention in general relates to a semiconductor device and also to a method of fabricating a semiconductor device. More particularly, the present invention relates to a ferroelectric memory including an array of memory cells utilizing ferroelectric capacitors, and also to a method of fabricating the ferroelectric capacitors.

2. Description of the Related Art

As the capacity and packing densities of semiconductor memory devices increase, storage capacitors take up larger portions of total area required for the memory cells of these devices. In order to shrink the size of memory cell capacitors and improve the overall packing density of memory cell devices, manufactures have preferred a one-transistor one-capacitor ("1T/1C") circuit with high density. These are referred to generally as dynamic random access memory (DRAM) devices. These circuits require refresh mechanisms to frequently restore the charge stored in each memory cell. Hence, these circuits are volatile in that memory loss will occur when power is removed such that refresh circuitry cannot operate.

Non-volatile memory is available in several forms. Conventional electrically programmable read only memory (EPROM), erasable electrically programmable read only memory (EEPROM) and flash EPROM devices store charge in the form of trapped charges in the memory cell's dielectric. The trapped charges are stable over a longer period of time, and so do not require dynamic refresh.

Ferroelectric materials have been used as storage cell dielectrics to provide non-volatile memory. Ferroelectric materials change state substantially permanently in response to an applied electric field. For example, lead zirconate titanate (PZT) permits a charge to be stored substantially permanently. Moreover, ferroelectric random access memory (FeRAM) operates at power levels similar to conventional DRAM and exhibits write speeds that are much faster than conventional non-volatile devices. Consequently, memory cells using ferroelectric capacitors can be fabricated into semiconductor memory devices with high packing density as compared to conventional non-volatile memory devices.

Ferroelectric memory cells have been fabricated that use two transistors and two ferroelectric capacitors, ("2T/2C") or a single transistor and a single ferroelectric capacitor ("1T/1C").

FIGS. 8–10 show how, in a conventional semiconductor memory device 10, an array of 2T/2C ferroelectric memory cells is fabricated. The memory cells include two field effect transistors in a site surrounded by a field oxide 12 that is deposited or grown in a surface 14 of a semiconductor substrate 16. The two field effect transistors (FETs) of each memory cell include source and drain regions 18 and 20 formed in the substrate 16, and two gate electrodes 22. One of the two gate electrodes 22 is disposed between the source region 18 and one of the drain regions 20, and the other gate electrode 22 is disposed between the source region 18 and the other drain region 20. The memory cells also include two parallel word lines. The two gate electrodes 22 are connected to or integral portions of the two word lines, respectively. The word lines are oriented in a first direction to interconnect two gate electrodes 22 of each of memory cells in the same column.

Following completion of fabrication for the field effect transistors, there is applied over the entire device a film 24 of dielectric material over the entire device. The memory cells include a bit line 26 connected to the source region 18 by a conductive region or contact plug 28. The bit line 26 is oriented in a second direction to interconnect the source regions 18 of memory cells in the same row. The first and second directions are oriented perpendicular to each other. The dielectric film 24 is etched to open areas above the drain regions 20. These open areas are filled with a conductive metal to form conductive regions or contact plugs 30. The upper surface of the dielectric film 24 and the filled conductive regions 30 are planarized to produce a single planar surface 32.

Referring to FIG. 8, a film 34 of bottom electrode material is applied to the planar surface 32. This film 34 initially covers the entire device. A film 36 of ferroelectric material is formed on the surface of the film 34. A film 38 of top electrode material is formed on the surface of the ferroelectric film 36.

Referring next to FIG. 9, a stack etch process is next carried out to form individual ferroelectric capacitors 40 over each of the selected conductive regions, such as 30. The stack etch simultaneously etches the top electrode 38 and the ferroelectric film 36 and then etches the bottom electrode 34 by ion milling.

Referring next to FIG. 10, there is applied over the entire device a film 42 of P-glass (phosphorous glass). This film 42 is etched to open two holes above the top electrodes 38 of the two ferroelectric capacitors 40 of each of the memory cells. These open holes are filled with a conductive metal to form contacts 44. Via these contacts 44, memory cells in the same column are connected to two parallel plate lines. The plate lines are oriented in the first direction. The resulting array of memory cells shown in FIG. 10 includes plate lines and bit lines 26 that are oriented perpendicular to each other. The demand for shrinking the size of ferroelectric capacitors is well recognized to improve the overall packing density of memory cell device. But, a problem has been experienced that has blocked the fabrication of any practical semiconductor memory device including ferroelectric capacitors of sufficiently reduced size. The problem includes the inability to form individual ferroelectric capacitors of sufficiently reduced size. As mentioned before in connection with FIG. 9, the stack etch process includes ion milling to etch the bottom electrodes 34 because the bottom electrode material is difficult to be etched by reactive etching. Naturally, during this ion milling, each ferroelectric film 36 is exposed at its four sides. During the ion milling, etching residue due to etching the bottom electrodes 34 adheres to the exposed sides of each ferroelectric film 36. The adhesion of such etching residue to the ferroelectric film 36 of each capacitor 40 may cause short in the capacitor 40.

To avoid occurrence of short in each ferroelectric capacitor 40, portions to be etched may be tapered, and etch process is carried out while sputtering the exposed sides of the ferroelectric film 36 of each capacitor 40. This etch may apply considerable etching damage to the exposed sides of the ferroelectric film 36 of each capacitor 40. As the area of each ferroelectric capacitor decreases, the damaged area takes up a larger portion of area required for the capacitor. This reduction in effective area for the capacitor poses a serious problem. Since portions to be etched are tapered, this etch process fails to meet demand for increased capacity and packing densities of memory devices.

To avoid etching damage applied to the exposed sides of the ferroelectric film 36 of each capacitor 40, JP-A 11-317500 proposes etching a film of bottom electrode material to form individual bottom electrodes 34 over each of the selected conductive regions, such as 30, as shown in FIG. 11. This JP-A 11-317500 corresponds to US 2001/0038115 A1 published Nov. 8, 2001. After completion of forming individual bottom electrodes 34, a film of ferroelectric material 36 is grown over the entire device as shown in FIG. 12. A film of top electrode material is formed over the surf ace of the ferroelectric film 36. Without etching the underlying ferroelectric film 36, the film of top electrode material only is etched to form top electrodes 38 over each of the bottom electrodes 34 as shown in FIG. 13. The top electrodes 38 of two ferroelectric capacitors 40 of each of the memory cells may be formed as integral portions of two parallel plate lines.

The ferroelectric film 36 can be deposited in a crystalline/poly-crystalline state by sol-gel or sputter technique. Crystallization temperature is higher than 600° C. It has been found that direct deposition of the ferroelectric material on the underlying dielectric film 24 encounters a chemical reaction problem that metal component of the ferroelectric material reacts with the dielectric material. This causes degradation of insulating performance of the dielectric film 24, causing degradation of insulation between the adjacent bottom electrodes 34. Further, diffusion of metal within the dielectric film 24 causes degradation in performance of FETs array. Moreover, the ferroelectric material deposited on the underlying dielectric film 24 is less crystallized than that deposited on each of bottom electrodes 34. It is likely that crystallization of the ferroelectric film around the sides of each bottom electrode is less than satisfactory, causing a degradation in capacitor property.

The preceding description on the conventional fabrication methods reveals various problems that have blocked the fabrication of any practical semiconductor memory device including ferroelectric capacitors of sufficiently-reduced size.

An object of the present invention is to provide a method of fabricating a semiconductor device having ferroelectric capacitors of sufficiently reduced size exhibiting satisfactory level of capacitor characteristic.

SUMMARY OF THE INVENTION

The present invention is a method of fabricating a semiconductor device having a plurality of conductive regions formed through a dielectric film that has a surface. The method comprises the steps of: forming a film of bottom electrode material entirely over the surface of the dielectric film; partially removing the bottom electrode film, until the surface of the dielectric film is exposed, to partially define a sidewall of each of bottom electrodes, which are to be formed on the plurality of conductive regions, respectively; forming a film of ferroelectric material on the remainder of the bottom electrode film and the exposed surface of the dielectric film; forming a film of top electrode material on the ferroelectric film; and partially removing the top electrode film, the ferroelectric film and the remainder of the bottom electrode film, until the surface of the dielectric film is exposed, to completely define the sidewall of each of the bottom electrodes.

The damage to the ferroelectric film is reduced because the sidewall of each of bottom electrodes is partially defined before it is completely defined during subsequent step of partially removing the top electrode film, the ferroelectric film and the remainder of the bottom electrode film.

BRIEF DESCRIPTION OF THE DRAWINGS

FIG. 14A is similar to FIG. 1 with the additional structure of the film of ferroelectric material 76 formed over the strip-like lands and the exposed surface regions of the surface 32 of the dielectric shown in FIG. 1.

DESCRIPTION OF THE EXEMPLARY EMBODIMENTS

Figure 1:
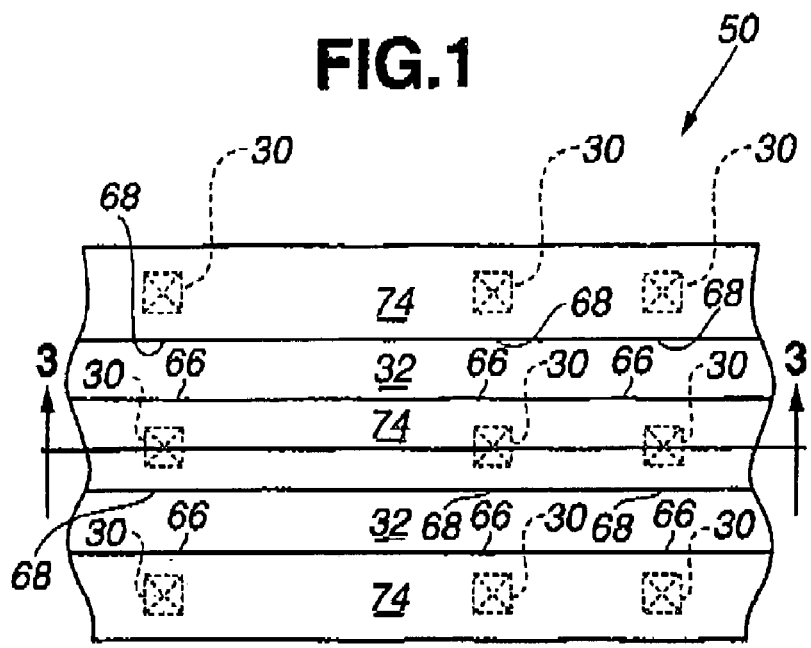
FIG. 1 is a plan view, viewing FIG. 3 in a direction as indicated by an arrow 1, of a partially fabricated semiconductor memory device, which is fabricated using one embodiment of the method according to the present invention.

Referring to the accompanying drawings, similar reference numerals are used throughout the figures to designate like or equivalent features.

While the following description of the present invention concerns an array of ferroelectric memory cells, each containing two transistors and two ferroelectric capacitors, ("2T/2C"), the present invention can be used to fabricate an array of ferroelectric memory cells, each containing a single transistor and single ferroelectric capacitor ("1T/1C").

Referring to FIGS. 1–5, a partly fabricated version of a semiconductor device 50 is illustrated. The semiconductor device 50, which has been fabricated by using the one embodiment of the present invention, is substantially the same as the conventional semiconductor device 10 until an upper surface of a dielectric film 24 and conductive regions 30 are planarized.

Figure 2:
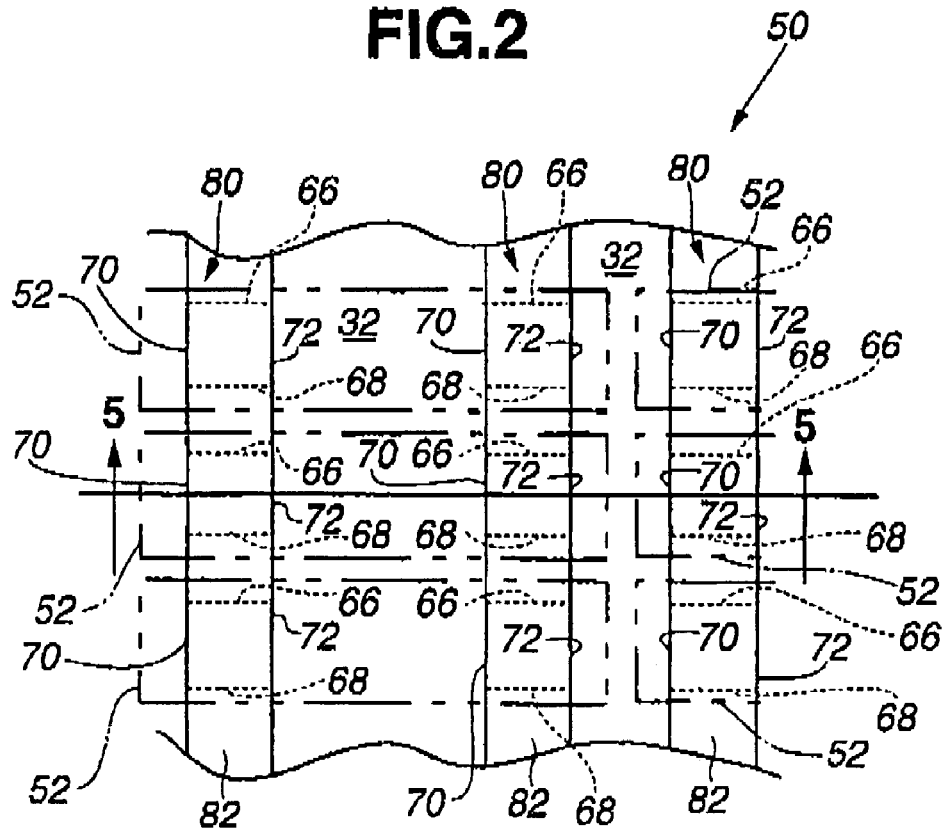
FIG. 2 is a plan view, viewing FIG. 5 in a direction as indicated by an arrow 2, of a fabricated semiconductor memory device, which is fabricated using one embodiment of the method according to the present invention.
Figure 5:
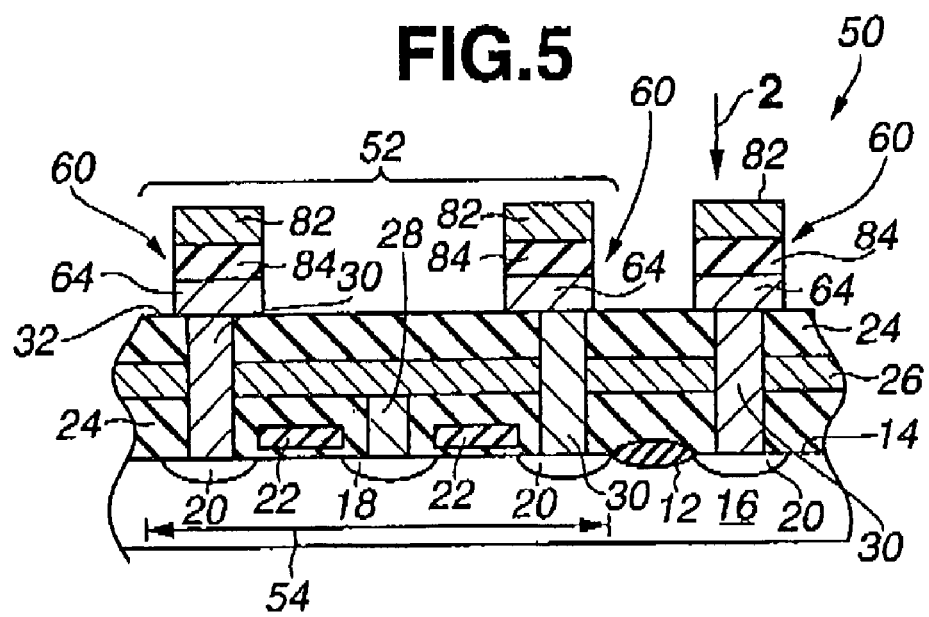
FIG. 5 is a cross-sectional view taken through the line 5—5 in FIG. 2.

This section provides brief explanation until formation of conductive regions 30 through the dielectric film 24. An array of 2T/2C ferroelectric memory cells is fabricated. In FIG. 2, the phantom line drawn rectangles 52 indicate three memory cells in a column together with three memory cells in next adjacent column. As shown in FIG. 5, the memory cells 52 include two field effect transistors in a site 54 surrounded by a field oxide 12 that is deposited or grown in a surface 14 of a semiconductor substrate 16. The two field effect transistors (FETs) of each memory cell 52 include source and drain regions 18 and 20 formed in the substrate 16, and two gate electrodes 22. One of the two gate electrodes 22 is disposed between the source region 18 and one of the drain regions 20, and the other gate electrode 22 is disposed between the source region 18 and the other drain region 20. The memory cells 52 also include two parallel word lines. The two gate electrodes 22 are connected to or integral portions of the two word lines, respectively. The word lines are oriented in a first direction to interconnect two gate electrodes 22 of each of memory cells 52 in the same column. Following completion of fabrication for the field effect transistors, there is applied over the entire device a film 24 of dielectric material over the entire device. The memory cells include a bit line 26 connected to the source region 18 by a conductive region or contact plug 28. The bit line 26 is oriented in a second direction to interconnect the source regions 18 of memory cells in the same row. The first and second directions are oriented perpendicular to each other. The dielectric film 24 is etched to open areas above the drain regions 20. These open areas are filled with a conductive metal to form conductive regions or contact plugs 30. The conductive regions 30 are formed through the dielectric film 24 that has a planar surface 32. As shown in FIG. 1, the conductive regions 30 are organized in columns and in rows.

Ferroelectric capacitors 60 are formed on the dielectric film 24 so as to make electrical contact with the underlying conductive regions or contact plugs 30, respectively.

A film of bottom electrode material 62 is formed entirely over the surface of dielectric film 24. The bottom electrode material 56 may be comprised of a single layer or multiple layers. In most cases, the bottom electrode layer 62 is comprised of multiple layers due to various reasons. The bottom electrode film 62 needs to be formed of (if single layer) or comprised of a surface layer formed of (if multiple layers) a conductive material, serving as catalyst during subsequent deposition of capacitor dielectric in a crystalline state by vapor growth technique using metal organic. The conductive material is comprised of a refractory metal such as Pt, Ir, Ru, Ti, W or its oxide or its nitride. Preferably, the conductive material is comprised of Pt, Ir, Ru, $IrO_2$, $RuO_2$, TiN, WN. Most preferably, the conductive material is comprised of Pt, Ir, Ru, $IrO_2$, $RuO_2$. If the bottom electrode film 62 is comprised of multiple layers, a surface or top layer may choose any appropriate material as underlying layer or layers. If the surface layer is comprised of Pt, the underlying TiN/Ti layer can be chosen. In this case, the bottom electrode film 62 is comprised of multiple layers Pt/TiN/Ti. In this case, the TiN layer works as a barrier layer to suppress diffusion of Ti. According to this multiple layered structure, as TiN has a crystal system with high grade of orientation, Pt will be oriented. This facilitates, as an advantage, orientation and crystallization during subsequent deposition of metal oxide ferroelectric film. For W contact plug, the bottom electrode film 62 is, preferably, comprised of Pt/TiN/Ti/W multiple layers.

Figure 3:
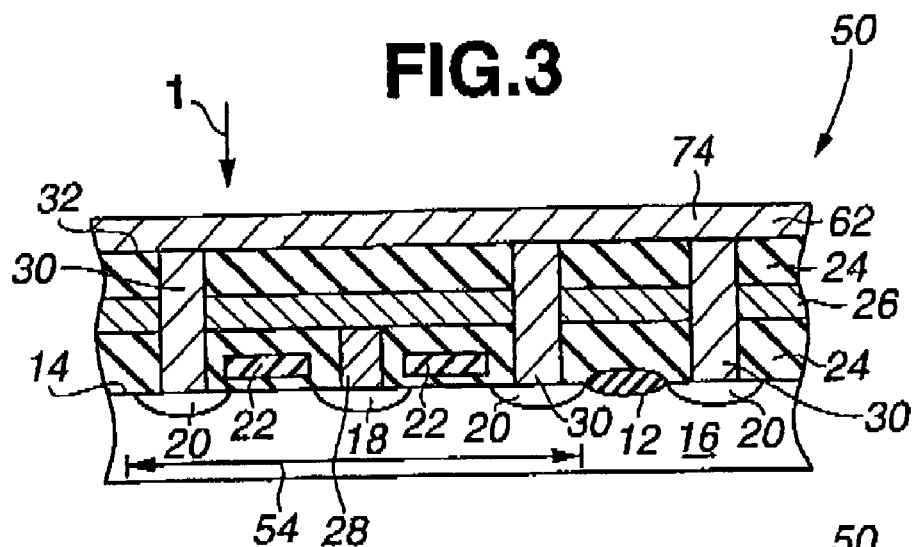
FIG. 3 is a cross-sectional view, taken through the line 3—3 in FIG. 1, of the partially fabricated semiconductor memory device, which is fabricated using one embodiment of the method according to the present invention.

Referring to FIGS. 1 and 3, the bottom electrode film 62 is patterned and etched. The bottom electrode film 62 is partially removed, until the surface 32 of the dielectric film 24 is exposed, to partially define a sidewall of each of bottom electrodes 64, which are to be formed on the conductive regions 30 (see FIGS. 2 and 5), respectively. The sidewall has four sides, which include one and opposite sides 66 and 68 and the remaining two sides 70 and 72 (see FIG. 2). Partially removing, by etch, the bottom electrode film 62 includes exposing first surface regions on the surface 32 to define the one and opposite sides 66 and 68 of the side wall for each of the bottom electrodes 64 (see FIGS. 1, 2 and 5). In the embodiment, the exposed first surface regions occupy strip-like area portions that are separated in a direction perpendicular to a direction in which the bit lines 26 are oriented as shown in FIG. 1. In this case, the removing of the bottom electrode film 62 includes or results in separating the bottom electrode film 62 into a plurality of strip-like lands 74. The strip-like lands 74 form the remainder of the bottom electrode film 62 and lie in the direction in which the bit lines 26 are oriented.

Figure 4:
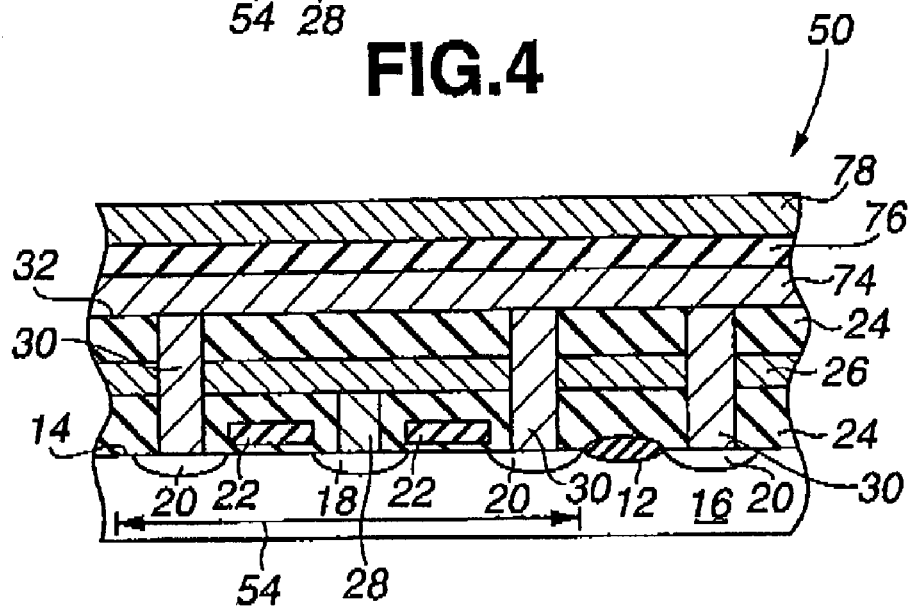
FIG. 4 is a cross-sectional view of the partially fabricated semiconductor memory device, which is fabricated using one embodiment of the method according to the present invention.
Figure 14A:
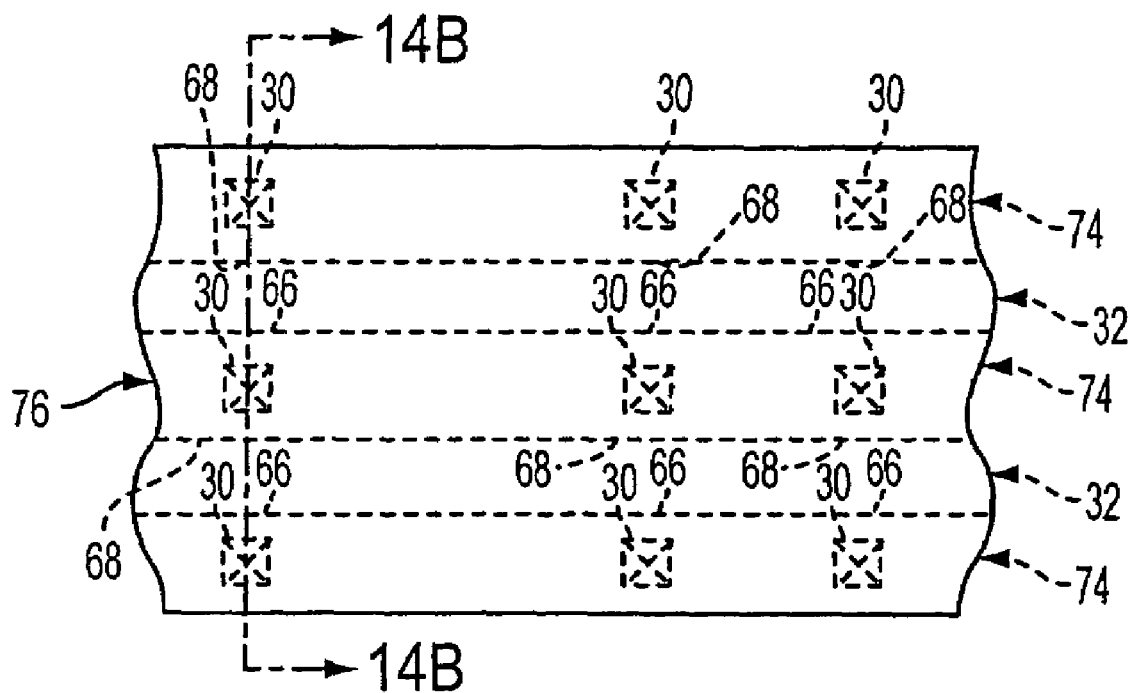
FIG. 14A is a plan view of a partially fabricated semiconductor memory device, which is fabricated using one embodiment of the method according to the present invention.
Figure 14B:
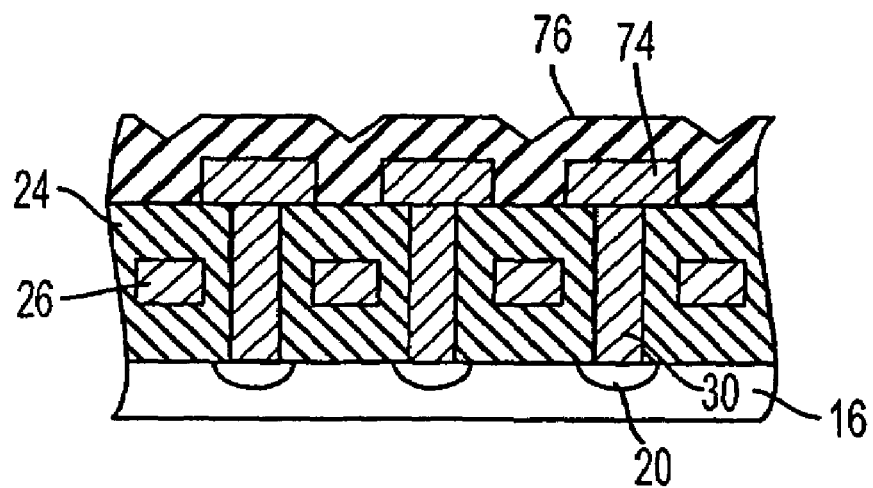
FIG. 14B is a cross-sectional view, taken through the line 14B—14B in FIG. 14A, of the partially fabricated semiconductor memory device, which is fabricated using one embodiment of the method according to the present invention.

Referring to FIGS. 4, 14A, and 14B, a film of ferroelectric material 76 is formed entirely over the strip-like lands 74 and the exposed surface regions on the surface 32 of the dielectric film 24. The ferroelectric film 76 is comprised of a ferroelectric material selected from $ABO_3$ perovskites, such as STO [$SrTiO_3$], BTO [$BaTiO_3$], BST [$(Ba,Sr)TiO_3$], PTO [$PbTiO_3$], PLT [$(Pb,La)TiO_3$], PZT [$Pb(Zr,Ti)O_3$], PLZT [$(Pb,La)(Zr,Ti)O_3$], PNbT [$(Pb,Nb)TiO_3$], or PNbZT [$(Pb,Nb)(Zr,Ti)O_3$]; and, their modified versions by substituting at least one of Hf, Mn and Ni for Zr if included as component. The most preferable choices for the capacitor dielectric are PTO, PLT, PLZT, PNbT and PNbZT; and their modified versions by substituting at least one of Hf, Mn and Ni for Zr if included as component. The preferred deposition technique for these ferroelectrics is metal organic chemical vapor deposition (MOCVD). The ferroelectric film 76 can be deposited in a crystalline state.

A film of top electrode material 78 is formed on the ferroelectric film 76. In FIG. 4, the top electrode film 78 is illustrated as just one layer. However, the top electrode film 78 can be implemented in multiple layers.

Referring to FIGS. 2 and 5, the entire stack is patterned and etched to partially remove the top electrode film 78, the ferroelectric film 76 and the first strip-like lands 74, until the surface 32 of the dielectric film 24 is exposed, to define the remaining sides 70 and 72 of each of the bottom electrodes 64 of the ferroelectric capacitors 60. As shown in FIG. 2, this etch process separates the top electrode film 78 and the ferroelectric film 76 into a plurality of second strip-like lands 80, and each of the underlying first strip-like lands 74 into the rectangular bottom electrodes 64. The second strip-like lands 80 lie perpendicularly to the direction in which the bit lines 26 are oriented. Each of the second strip-like lands 80 is comprised of a top electrode 82 and the underlying capacitor dielectric 84. The top electrode 82 and the underlying dielectric 84 are common to the ferroelectric capacitors in the same column. In this embodiment, the top electrodes 82 function as plate lines.

Each of the remaining two bottom electrode sides 70 and 72 and the adjacent side of the capacitor dielectric 84 formed out of the ferroelectric film 62 are formed out of a common cutting or etched plane. As one two sides are formed by etch in forming the capacitor dielectrics 84 out of the ferroelectric film 62, the process or etch damage to the capacitor dielectrics 84 can be reduced.

According to the embodiment, the metal organic chemical vapor deposition (MOCVD) is carried out on the exposed portions on the surface 32 of the dielectric film 24 as well as on the remainder of the bottom electrode film 34. The growth of crystallization on the dielectric film 24 is less than that on the bottom electrode film 62. This is because, during the processing, the dielectric film 24 cannot provide crystal nucleus as the bottom electrode film 34 does.

According to understanding of the inventor, the MOCVD requires sufficient population of crystal nuclei on an electrode to provide satisfactory crystallization of organic metal. Unless formation of crystal nuclei in the initial stage, crystallization cannot grow. The bottom electrode film 62 performs strong catalytic action that increases the rate of depositing crystal nuclei out of certain organic metal source gas. The underlying dielectric film 24, which is partly exposed, cannot perform such strong catalytic action. Thus, the formation of sufficient population of crystal nuclei on the exposed dielectric film is very difficult.

Population of crystal nuclei as high as a satisfactory level may be difficult to achieve if total area of bottom electrode film 62 after patterning becomes small as packing density increases, In the MOCVD, after completion of covering the surface of bottom electrode film 62 with ferroelectric film, the rate of action in the source gas without any assist of the catalytic action determines the composition.

Crystallization on bottom electrodes near the periphery of its array grows less than it does on the other bottom electrodes of the array as each bottom electrode decreases in area.

Figure 6:
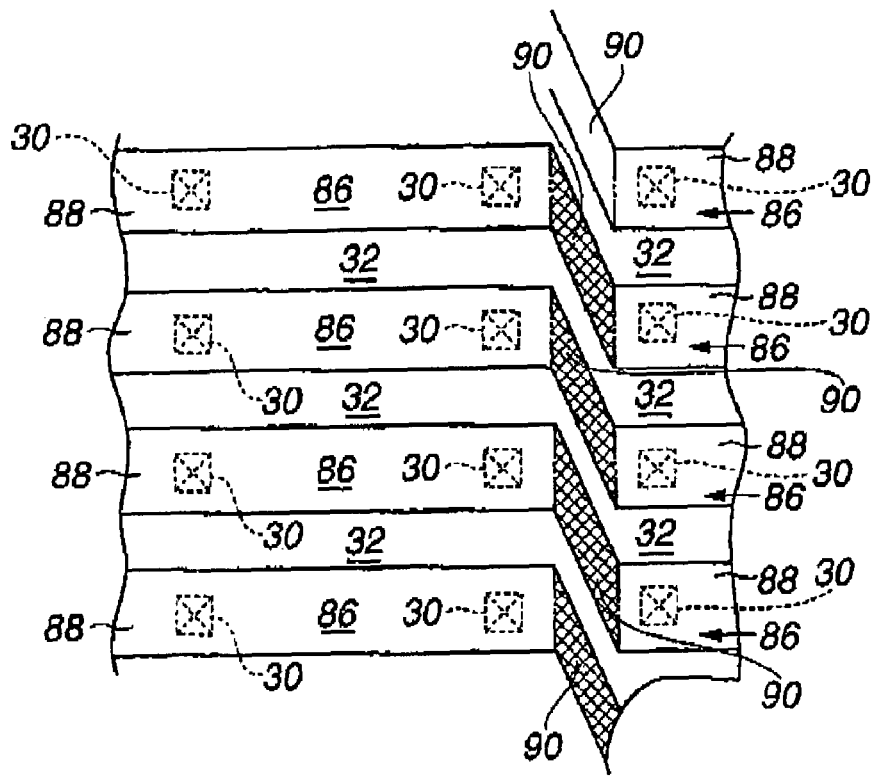
FIG. 6 is a plan view, similar to FIG. 1, of a partially fabricated semiconductor memory device, which is fabricated using another embodiment of the method according to the present invention.

Patterning the bottom electrode film 62 is not limited to the example illustrated in FIG. 1. FIG. 6 illustrates a modified version of patterning the bottom electrode film 62 accounting for the above-mentioned issue.

Referring to FIG. 6, the process of patterning and etching separates the bottom electrode film 62 into a plurality of lands 86, which include strip-like land sections 88 lying on conductive regions 30 and junctions 90, each interconnecting the adjacent two of said strip-like land sections 88. The junctions 90 provide increased areas devoted to crystallization in the neighborhood of sides of capacitor bottom electrodes as compared to the example illustrated in FIG. 1.

Figure 7:
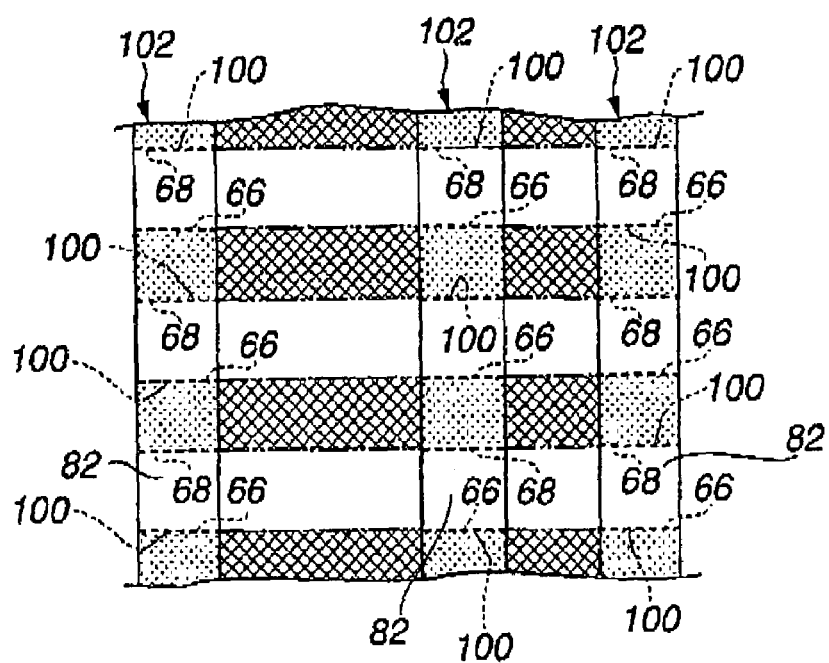
FIG. 7 is a plan view, similar to FIG. 2, of a fabricated semiconductor memory device, which is fabricated using further embodiment of the method according to the present invention.
Figure 8:
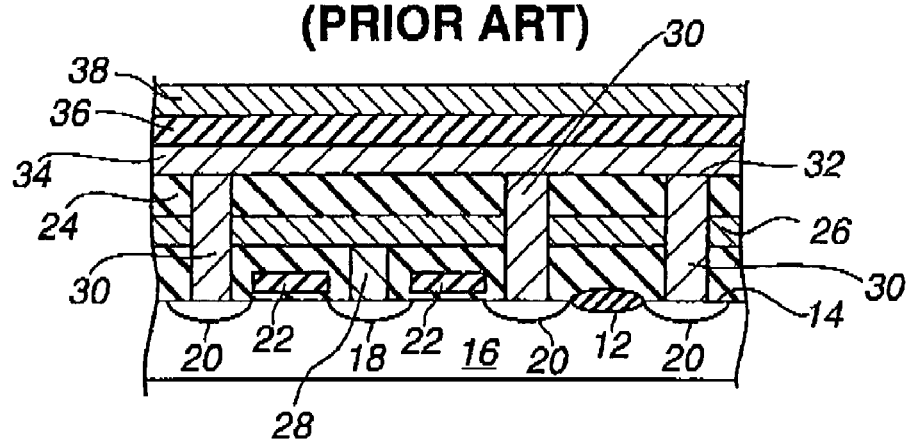
FIGS. 8–10 are cross-sectional views of a partially fabricated semiconductor memory device, which is fabricated using one of the before discussed conventional methods.
Figure 9:
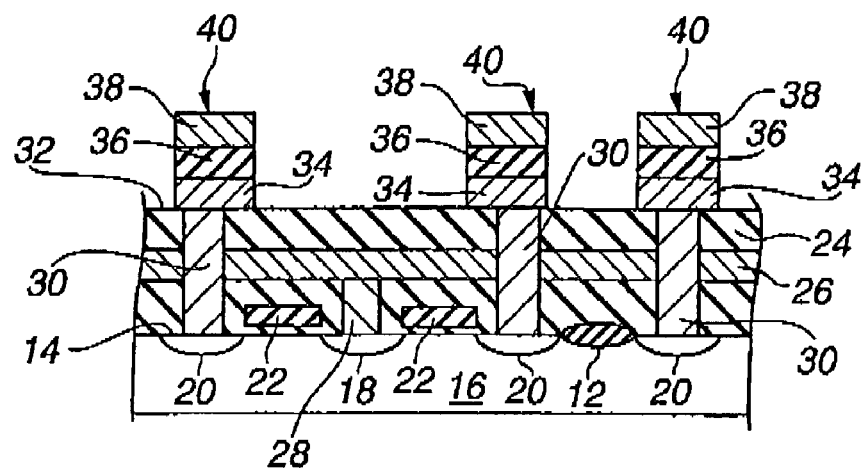
Figure 10:
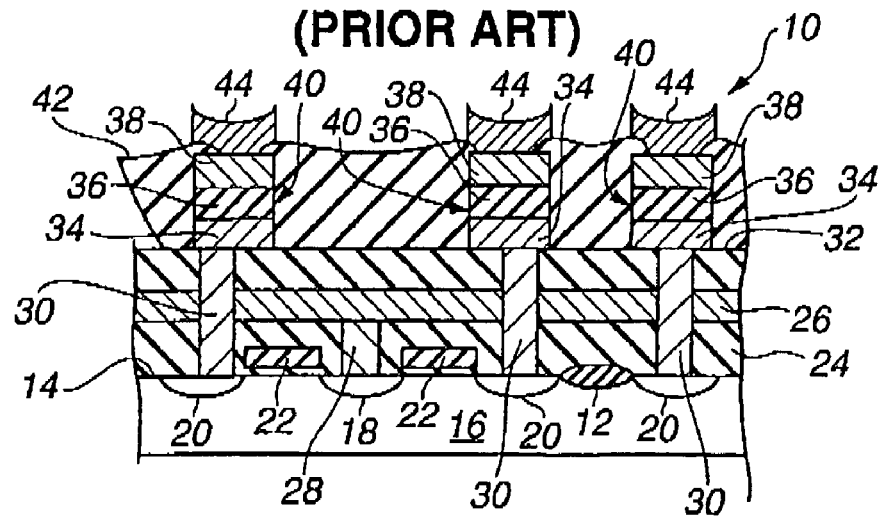
Figure 11:
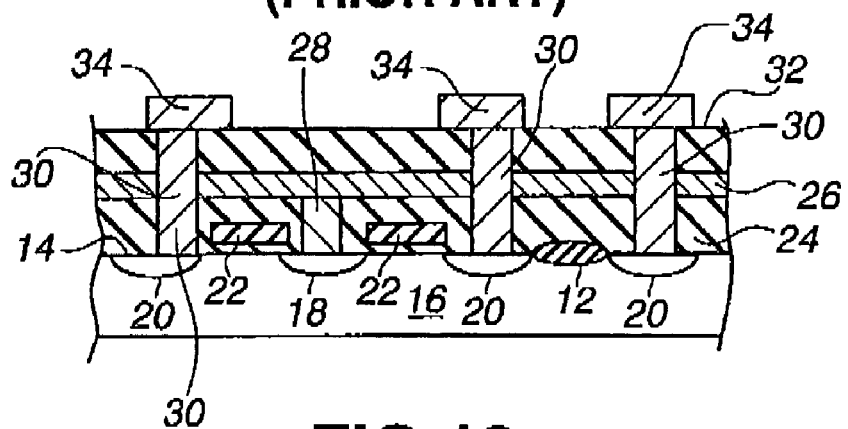
FIGS. 11–13 are cross-sectional views of a partially fabricated semiconductor memory device, which is fabricated using the other conventional method.
Figure 12:
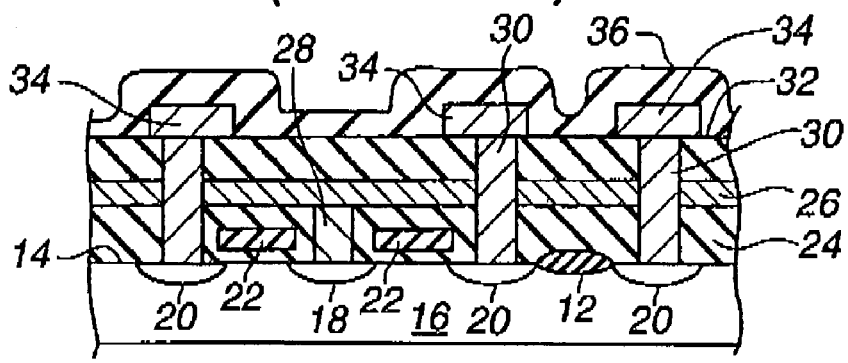
Figure 13:
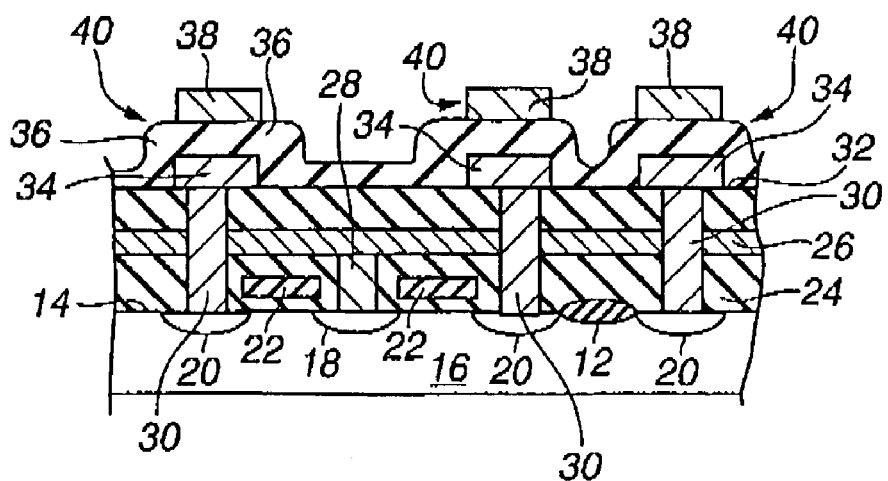

Referring to FIG. 7, the process of patterning and etching forms independent rectangular holes 100 through a single land of the bottom electrode film to expose first spaced surface regions on the surface of the dielectric film to define one and the opposite sides 66 and 68 of the sidewall for each of capacitor bottom electrodes. Subsequently, partially removing the top electrode film, the ferroelectric film and the remainder of said bottom electrode film includes separating the top electrode film, said ferroelectric film and the remainder of said bottom electrode film into a plurality of strip-like lands 102 lying on the conductive regions and covering the independent holes 100. In this case, the rectangular areas illustrated by meshed rectangles provide increased areas devoted to crystallization in the neighborhood of sides of capacitor bottom electrodes as compared to the example illustrated in FIG. 1.

While the preceding description of the present invention concerns an array of 2T/2C ferroelectric memory cells, the present invention is not limited to this application. The present invention is applicable also to fabrication of an array of 1T/1C ferroelectric memory cells.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-155505, filed May 29, 2002, the disclosure of which is hereby incorporated by reference in its entirety.

What is claimed is:

1. A method of fabricating a semiconductor device having a plurality of conductive regions formed through a dielectric film that has a surface, comprising the steps of:
   forming a film of bottom electrode material entirely over said surface of said dielectric film;
   partially removing said bottom electrode film, until said surface of said dielectric film is exposed, to partially define a sidewall of each of bottom electrodes, which are to be formed on said plurality of conductive regions, respectively;
   forming a film of ferroelectric material on the remainder of said bottom electrode film and said exposed surface of said dielectric film;
   forming a film of top electrode material on said ferroelectric film; and
   partially removing said top electrode film, said ferroelectric film and the remainder of said bottom electrode film, until said surface of said dielectric film is exposed, to completely define said sidewall of each of said bottom electrodes.

2. The method as claimed in claim 1, wherein said sidewall includes four sides.

3. The method as claimed in claim 2, wherein said step of partially removing said bottom electrode film includes:
   exposing first surface regions on said surface of said dielectric film to define one and the opposite sides of said sidewall for each of said bottom electrodes.

4. The method as claimed in claim 3, wherein said step of partially removing said top electrode film, said ferroelectric film and the remainder of said bottom electrode film includes:
   exposing second surface regions on said surface of said dielectric film to define the remaining two sides of said sidewall for each of said bottom electrodes.

5. The method as claimed in claim 4, wherein said conductive regions are organized in columns and in rows.

6. The method as claimed in claim 5, wherein, immediately after the step of partially removing said bottom electrode film, said first exposed surface regions are organized in rows and in columns.

7. The method as claimed in claim 6, wherein, immediately after the step of partially removing said top electrode film, said ferroelectric film and the remainder of said bottom electrode film, said second exposed surface regions constitute a plurality of parallel strip-like surface regions, which lie along the columns in which said conductive regions are organized.

8. The method as claimed in claim 2, wherein said step of partially removing said bottom electrode film includes:
   forming independent holes through a single land to expose first spaced surface regions on said surface of said dielectric film to define one and the opposite sides of said sidewall for each of said bottom electrodes.

9. The method as claimed in claim 8, wherein said step of partially removing said top electrode film, said ferroelectric film and the remainder of said bottom electrode film includes:

separating said top electrode film, said ferroelectric film and the remainder of said bottom electrode film into a plurality of strip-like lands lying on said conductive regions and covering said independent holes.

10. The method as claimed in claim 2, further comprising the steps of:

forming parallel bit lines; and forming parallel plate lines, said bit lines and said plate lines being oriented in a predetermined relationship to each other.

11. The method as claimed in claim 10, wherein said predetermined relationship is perpendicular relationship.

12. The method as claimed in claim 11, wherein said step of partially removing said bottom electrode film includes:

separating said bottom electrode film into a plurality of first strip-like lands, which lie in a direction in which said bit lines are oriented.

13. The method as claimed in claim 12, wherein said step of partially removing said top electrode film, said ferroelectric film and the remainder of said bottom electrode film includes:

separating said top electrode film and said ferroelectric film into a plurality of second strip-like lands lying perpendicularly to the direction in which said bit lines are oriented and said first strip-like lands into the bottom electrodes underlying the second strip-like lands.

14. The method as claimed in claim 10, wherein said step of partially removing said bottom electrode film includes:

forming one and opposite sides of said sidewall for each of said bottom electrodes as arranged along parallel lines that are oriented in a direction in which said bit lines are oriented; and wherein said step of partially removing said top electrode film, said ferroelectric film and the remainder of said bottom electrode film includes:

forming each of the remaining two sides of said sidewall and the adjacent sides of said ferroelectric film out of a common cutting plane.

15. The method as claimed in claim 14, wherein said step of partially removing said bottom electrode film includes:

separating said bottom electrode film into a plurality of first strip-like lands, which lie in a direction in which said bit lines are oriented.

16. The method as claimed in claim 15, wherein said step of partially removing said top electrode film, said ferroelectric film and the remainder of said bottom electrode film includes:

separating said top electrode film and said ferroelectric film into a plurality of second strip-like lands lying perpendicularly to the direction in which said bit lines are oriented and said first strip-like lands into the bottom electrodes underlying the second strip-like lands.

17. The method as claimed in claim 2, wherein said step of partially removing said bottom electrode film includes:

forming one and opposite sides of said sidewall for each of said bottom electrodes; and wherein said step of partially removing said top electrode film, said ferroelectric film and the remainder of said bottom electrode film includes:

forming each of the remaining two sides of said sidewall and the adjacent side of said ferroelectric film out of a common cutting plane.

18. The method as claimed in claim 1, wherein said step of partially removing said bottom electrode film includes:

separating said bottom electrode film into a plurality of lands, which include strip-like land sections lying on said conductive regions and junctions, each interconnecting the adjacent two of said strip-like land sections, said junctions providing increased areas devoted to crystallization of said ferroelectric film in the neighborhood of said partially defined sidewall of each of said bottom electrodes.

19. A semiconductor device fabricated according to the method as claimed in claim 1.

* * * * *